United States Patent [19]

Kuramoto

[11] Patent Number: 4,478,885
[45] Date of Patent: Oct. 23, 1984

[54] SURFACE TREATING AGENT

[75] Inventor: Takeo Kuramoto, Kanagawa, Japan

[73] Assignee: W. R. Grace K.K., Tokyo, Japan

[21] Appl. No.: 506,158

[22] Filed: Jun. 20, 1983

[30] Foreign Application Priority Data

Jan. 28, 1983 [JP] Japan .................................. 58-11248

[51] Int. Cl.$^3$ ............................................. B41L 23/00
[52] U.S. Cl. .................................... 427/144; 101/170; 427/421
[58] Field of Search ................. 427/144, 421; 101/170

[56] References Cited

U.S. PATENT DOCUMENTS

| T868,017 | 1/1969 | Boardman | 427/144 |
|---|---|---|---|
| 3,429,846 | 2/1969 | Bechtold et al. | 427/421 |
| 3,716,393 | 2/1973 | Baker et al. | 427/421 |
| 4,208,466 | 6/1980 | Szur | 427/421 |
| 4,232,087 | 11/1980 | Trask | 427/421 |
| 4,253,999 | 3/1981 | Okishi | 427/144 |
| 4,321,177 | 3/1982 | Wilkinson | 427/421 |

FOREIGN PATENT DOCUMENTS

| 71627/81 | 6/1981 | Australia . |
| 42105 | 6/1981 | European Pat. Off. . |
| 1096048 | 4/1965 | United Kingdom . |

Primary Examiner—Michael R. Lusignan
Assistant Examiner—Janyce A. Bell
Attorney, Agent, or Firm—William L. Baker; Carole F. Barrett

[57] ABSTRACT

The present invention is directed to a method for treating resin printing plates to prevent or reduce smudging and/or linting using fluorocarbon surface active agent having a perfluoroalkyl group with 4 to 14 carbon atoms. The surface active agent may be anionic, cationic or ampholytic and may be used in an aqueous, alcohol or aqueous-alcohol solution.

9 Claims, No Drawings

SURFACE TREATING AGENT

BACKGROUND OF INVENTION

The present invention relates to a method of preventing or reducing linting and/or smudging on resin based printing plates by treating with a surface treating agent. In the method of the present invention the surface treating agent is an anionic, cationic or ampholytic fluorocarbon having a perfluoroalkyl group with 4 to 14 carbon atoms. The fluorocarbon of the present invention may be used in aqueous, alcohol or aqueous-alcohol solution to pretreat relief printing plates and prevent or alleviate smudging.

In the past, the plates generally used in high-speed rotary presses such as those used in newspaper printing were metal, for example zinc or aluminum. However, in recent years the trend has been away from use of the conventional metal plates and towards use of resin based plates. A variety of resins have been used in forming resin based plates, however, in general the resins chosen are photo-sensitive.

The change to resin based plates was due to lower cost and increased ease of handling. Although the resin based plates are easier to work with, they have the disadvantage of allowing ink to build up in the depressions (concave sections) of the relief printing plates. When ink builds up in the depressions of the image, smudging of the dots occurs. Although the mechanism of this smudging is not fully understood, it is known that when ink or dust accumulates in the depressions of a relief plate during printing smudging occurs and results in a reduction of the halftone grid quality.

In the past, smudging was prevented by treating the resin plates with agents which were made by dissolving silicone oil in a hydrocarbon solvent or with agents which were water repellent and oil repellent. However, it was found that agents which were made by dissolving silicone oil in hydrocarbon solvent were not sufficiently durable because they dissolved easily in the ink. As a result, smudging occurs after about 20,000 impressions. The latter type of agent is not effective unless complete heat-curing is conducted after the pretreatment. Additionally, even if heat-cured, smudging occurs in plates treated with agents of the latter type after about 30,000 impressions.

It is an object of the present invention to provide a method of treating a printing plate with to surface agent which prevents or alleviates the smudging of dots in relief printing plates used in high speed rotary presses, particularly those used in newspaper printing.

SUMMARY OF INVENTION

The present invention is a method of preventing smudging and/or linting by treating the surface of the plate with a surface agent composed of an anionic, cationic or ampholytic fluorocarbon having a perfluoroalkyl group with 4 to 14 carbon atoms. An aqueous, alcohol or aqueous-alcohol solution of the surface agent is useful for treating the surface of resin relief printing plates, especially those used in high speed rotary presses.

DETAILED DESCRIPTION

According to the present invention, an agent comprised of an anionic, cationic or ampholytic fluorocarbon having a 4 to 14 carbons is used as a surfactant for treating the surface of relief type printing plates. By the term ampholytic is meant a substance which is cationic in an acid media and anionic in a basic media. The preferred agent is cationic.

In the present invention, the surface of the resin plate is treated with the surface active agent in an aqueous, alcohol or aqueous alcohol solution. Treatment may be by spraying, brush coating, dipping or other suitable method selected by one skilled in the art. When the resin plate thus coated with the fluorocarbon surface active agent is used in printing with a rotary press, ink and dust do not accumulate in the depressions of the relief plates. It appears that the water repellency, oil repellency and smudge preventing functions of the fluorocarbon combine to exhibit a synergistic effect and prevent the smudging.

The fluorocarbon surface active agent having the perfluoroalkyl group (4 to 14 carbon atoms) of the present invention can be optionally selected from anionic, cationic and ampholytic surface active agents obtained by various known synthesizing methods. Examples of effective anionic surface active agent include: perfluoroalkyl ($C_6$–$C_{10}$)-N-ethylsulfonylglycine salt, perfluoroalkyloctanoic acid ammonium salt, 2-perfluoroalkyl ($C_4$–$C_{14}$) ethylpolyoxyalkylene ($C_2$–$C_3$) sulfate and its salt, perfluoroalkyl ($C_8$–$C_{12}$) oxybenzene sulfonate, disodium N-perfluorooctanesulfonyl glutamate, sodium 3-(N-perfluorooctanesulfonyl-N-ethylamino)-1-propanesulfonate, and perfluoroalkyl ($C_4$–$C_{12}$) sulfonate. Examples of effective cationic surface active agent include perfluoroalkyl ($C_6$–$C_{10}$) sulfamidopropyl-trimethylammonium salt and N-(3-perfluorooctanoylamido)-propyl)-N,N,N-trimethylammonium chloride. An example of an effective ampholytic surface active agent is N-(3-(perfluorooctanesulfonamido)propyl)-N,N-dimethyl-N-carboxymethylammoniumbetaine. Of course, the surface active agents in this invention are not limited by these examples. In short, any surface active agents having a perfluoroalkyl group with 4 to 14 carbons and a terminal group of an anionic, cationic or ampholytic structure maybe used. Of these, the cationic compounds are preferred because they possess a good durability to various resin plates. This is because the adsorptivity of the cationic compounds is greater than that of the anionic and ampholytic compounds.

The fluorocarbon surface active agent of this invention is applied to the resin plate in the form of an aqueous solution, alcohol solution or aqueous alcohol solution. Its concentration is preferably greater than about 0.001% weight as an effective component and more preferably the concentration is at least about 0.5% by weight. If the concentration is less than about 0.001% by weight, the effect is poor. Although the concentration has no upper limit, when the concentration exceeds 5% by weight the cost is high. Methods such as dipping or immersion, brush coating, spray coating, roller coating, etc. may be used as the treating method.

Examples of the resin plate to which the present invention is applicable include polyvinyl alcohol resin plates, e.g. "NAPP" (phonetic) sold by Napp System Japan K.K., "Rigiron" (phonetic) and "POP" sold by Tokyo Oka Kogyo K.K.; polyester resin plates, e.g. "APR" sold by Asahi Chemical Industry Co., Ltd.; polyurethane resin plates, e.g. "LETTERFLEX" sold by W. R. Grace, K.K.; nylon resin plates; e.g. "PRINTIGHT" (phonetic) sold by Toyobo Co., Ltd. and "Toreleaf" (phonetic) sold by Fuji Photo Film Co., Ltd. However, the resin plate in this invention is not limited by these examples. The following Examples and Comparative Examples illustrate this invention specifically.

EXAMPLE 1

A surface treating agent comprising an aqueous solution of 0.5% by weight of sodium 3-(N-perfluorooctanesulfonyl-N-ethylamino)-1-propane sulfonate was prepared. The treating agent was sprayed in a coating amount of 10 g/m$^2$ onto a commercially available LETTERFLEX plate (urethane resin plate). This treated resin plate did not smudge until about 60,000 impressions were made.

EXAMPLE 2

An aqueous solution of 0.5% by weight of perfluorooctylsulfamidopropyltrimethylammonium salt was prepared and applied as in Example 1. No smudging occurred until about 70,000 impressions were made.

EXAMPLE 3

An alcohol solution of 0.5% by weight of N-(3-(perfluorooctanesulfonamide)propyl-N,N-dimethyl-N-carboxymethylammoniumbetaine was prepared and applied as in Example 1. No smudging occurred until about 60,000 impressions were made.

COMPARATIVE EXAMPLE 1

For comparison, the printing was conducted with an untreated LETTERFLEX plate. Smudging occurred when about 10,000 impressions were made.

EXAMPLE 4

The agent used in Example 2 was applied to a commercially available polyester resin plate in the same manner as in Example 2. No smudging occurred until about 50,000 impressions were made.

COMPARATIVE EXAMPLE 2

For comparison, the printing was carried out with a commercially available untreated polyester resin plate. As a result, smudging occurred after only 5,000 impressions were made.

COMPARATIVE EXAMPLE 3

A conventional surface treating agent comprising a silicone oil dissolved in a hydrocarbon solvent, i.e. "JUSHIHANYO HYOMENSHORIZAI" (surface treating agent for use in resin plate) sold by Nippon Shinbun Ink K.K.; was applied as in Example 1. Smudging occurred after about 20,000 impressions were made.

EXAMPLES 5–18 AND COMPARATIVE EXAMPLES 4–8

Each of the following fluorocarbon surface active aents A–J was dissolved in a given concentration in each of solvents tabulated below. The resultant solution was sprayed onto each of various commercially available resin plates in a coating amount of 10 g/m$^2$. The results are indicated in Table I.

A: Sodium 3-(N-perfluorooctanesulfonyl-N-ethylamino)-1-propanesulfonate
B: Perfluorooctylsulfamidopropyltrimethylammonium salt
C: N-(3-(perfluorooctanesulfonamido)propyl)-N,N-dimethyl-N-carboxymethylammoniumbedaine
D: Sodium 2-perfluorooctylethylpolyoxyalkylene ($C_2$–$C_3$) sulfate
E: Sodium perfluorononyloxybenzenesulfonate
F: 2-Perfluorononyl-1-methyl-ethylphosphate ammonium salt
G: Perfluorooctyl-N-ethylsulfonylglycine salt (potassium)
H: N-(3-(perfluorooctanoylamido)propyl)-N,N,N-trimethylammonium chloride
I: Disodium N-perfluorooctanesulfonyl glutamate
J: Potassium perfluorooctylsulfonate

TABLE 1

| Example No. | Fluorocarbon surface active agent | Concentration of solution (wt. %) | Solvent | Type of resin plate | Sheets of printed paper with no smudge detected |
|---|---|---|---|---|---|
| Comparative Example 4 | A | 0.0005 | Water | Urethane | 11,000 |
| Example 5 | A | 2 | " | " | 62,000 |
| Example 6 | A | 5 | " | " | 65,000 |
| Example 7 | A | 7 | " | " | 65,000 |
| Comparative Example 5 | B | 0.0005 | " | " | 12,000 |
| Example 8 | B | 5 | " | " | 75,000 |
| Example 9 | B | 7 | " | " | 75,000 |
| Comparative Example 6 | C | 0.0005 | Methanol | " | 11,000 |
| Example 10 | C | 5 | " | " | 65,000 |
| Example 11 | C | 7 | " | " | 65,000 |
| Example 12 | D | 0.5 | Water | Polyester | 45,000 |
| Example 13 | E | 0.5 | " | Polyvinyl alcohol | 45,000 |
| Example 14 | F | 0.5 | " | Nylon | 45,000 |
| Example 15 | G | 0.5 | " | Urethane | 60,000 |
| Example 16 | H | 0.5 | " | Polyester | 50,000 |
| Example 17 | I | 0.5 | " | Polyvinyl alcohol | 45,000 |
| Example 18 | J | 0.5 | " | Nylon | 45,000 |
| Comparative Example 7 | Not used | — | — | Polyvinyl alcohol | 8,000 |
| Comparative | Not used | — | — | Nylon | 10,000 |

TABLE I-continued

| Example No. | Fluorocarbon surface active agent | Concentration of solution (wt. %) | Solvent | Type of resin plate | Sheets of printed paper with no smudge detected |
| --- | --- | --- | --- | --- | --- |
| Example 8 | | | | | |

Table I shows that when treatment with fluorocarbon surface active agents was omitted (Comparative Examples 7 and 8) only 8,000 and 10,000 impressions were made before smudging was detected. Likewise, when the concentration of fluorocarbon surface active agent was 0.0005% by weight (Comparative Examples 4, 5 and 6) only 11,000 or 12,000 impressions were made without smudging. By contrast, Examples 5–18, which are within the present invention, show that in excess of about 45,000 impressions can be made when the concentration of fluorocarbon surface active agent is at least about 0.5% by weight.

What is claimed is:

1. A method of reducing linting or smudging on resin based relief printing plates comprising treating the printing plate with a surface treating agent comprised of an anionic, cationic or ampholytic fluorocarbon having a perfluoroalkyl group with 4 to 14 carbon atoms.

2. The method of claim 1 wherein the surface treating agent comprises an aqueous, alcohol or aqueous-alcohol solution.

3. The method of claim 1 or 2 wherein the surface treating agent is anionic and is selected from the group consisting of perfluoroalkyloctanoic acid ammonium salt, 2-perfluoroalkyl ($C_4$–$C_{14}$) ethylpolyoxyalkylene ($C_2$–$C_3$) sulfate or its salt, perfluoroalkyl ($C_8$–$C_{12}$) oxybenzene sulfonate, disodium N-perfluorooctanesulfonyl glutamate, sodium 3-(N-perfluorooctanesulfonyl-N-ethylamino)-1-propanesulfonate, and perfluoroalkyl ($C_4$–$C_{12}$) sulfonate.

4. The method of claim 1 or 2 wherein the surface treating agent is cationic and is selected from the group consisting of perfluoroalkyl ($C_6$–$C_{10}$) sulfamidopropyltrimethylammonium salt and N-(3-(perfluorooctanoylamido)-propyl)-N,N,N-trimethylammonium chloride.

5. The method of claim 1 or 2 wherein the surface treating agent is ampholytic and is N-(3-(perfluorooctanesulfonamido)propyl)-N,N-dimethyl-N-carboxymethylammoniumbetaine.

6. The method of claim 2 wherein the surface treating agent is in concentration of more than about 0.001% by weight.

7. The method of claim 6 wherein the concentration of the surface treating agent is in the range of about 0.001% to about 5% by weight.

8. A method of reducing linting or smudging on resin based printing plates comprising spray coating the printing plate with a surface treating agent comprised of an anionic, cationic or ampholytic fluorocarbon having a perfluoroalkyl group with 4 to 14 carbon atoms.

9. A method of claim 8 wherein the surface treating agent comprises an aqueous, alcohol or aqueous-alcohol solution.

* * * * *